United States Patent [19]

Venkatasetty

[11] 4,247,359

[45] Jan. 27, 1981

[54] PREPARATION OF EPITAXIAL RARE EARTH THIN FILMS

[75] Inventor: Hanumanthiya V. Venkatasetty, Burnsville, Minn.

[73] Assignee: Honeywell Inc., Minneapolis, Minn.

[21] Appl. No.: 955,741

[22] Filed: Oct. 30, 1978

Related U.S. Application Data

[63] Continuation of Ser. No. 801,986, May 31, 1977, abandoned.

[51] Int. Cl.$^3$ .............................................. C30B 23/06
[52] U.S. Cl. ............................ 156/613; 156/DIG. 63
[58] Field of Search ............... 156/610, 613, DIG. 63, 156/614; 148/175; 260/707, DIG. 35; 423/263; 252/62.3 E

[56] References Cited

U.S. PATENT DOCUMENTS

| | | | |
|---|---|---|---|
| 3,131,082 | 4/1964 | Gambino | 423/263 |
| 3,131,082 | 4/1964 | Gambino | 117/49 |
| 3,326,948 | 6/1967 | Cais et al. | 260/429 |
| 3,615,168 | 10/1971 | Wehmeier | 23/21 |
| 3,856,582 | 12/1974 | Smeiggil et al. | 148/105 |

FOREIGN PATENT DOCUMENTS 2092896  1/1972  France .................................... 148/175

OTHER PUBLICATIONS

Encyclopedia Britannica V. III Micropaedia, William Benton Pub.

*Primary Examiner*—Hiram Bernstein
*Attorney, Agent, or Firm*—Charles G. Mersereau

[57] ABSTRACT

A method of preparing epitaxial thin films of metallic rare earth garnets by chemical vapor deposition utilizes organometallic ligand compounds of rare earth metals including scandium, yttrium, lanthanum and the lanthanides ($Z=58$ through 71) with organic compounds including acetylacetone, benzoylacetone, thenoyl trifluoroacetone, fluorinated benzoylacetone, tri-n-butylphosphate, tri-n-octylphosphine oxide and sodium cyclopentadienide and 2,2,6,6-tetramethyl 3,5-heptanedione.

2 Claims, No Drawings

PREPARATION OF EPITAXIAL RARE EARTH THIN FILMS

This is a continuation of application Ser. No. 801,986 filed May 31, 1977, now abandoned.

BACKGROUND OF THE INVENTION

1. Field of the Invention

The present invention relates generally to the field of preparation of epitaxial thin films of magnetic rare earth garnets by chemical vapor deposition and, in particular, to the use of certain organometallic compounds as the source of the rare earth metals for the chemical vapor deposition.

2. Description of the Prior Art

Epitaxial garnet thin films of rare earths and other metals are utilized for applications in high frequency devices such as microwave devices common in bubble domain memories for the computer industry and magneto-optic devices. In the prior art, several methods have been employed to produce epitaxial garnet thin films of rare earth metals or rare earth metals in combination with transition metals by chemical vapor deposition.

One principle method utilizes rare earth or transition metal halides (normally chlorides) as the starting materials. Examples of this method are found in U.S. Pat. Nos. to Gambino 3,131,082 issued Apr. 28, 1964 and Wehmeier 3,615,168 issued Oct. 26, 1971. While this method has met with some success, it does suffer from several drawbacks one of which is the relatively low vapor pressures exhibited by the compounds which requires relatively high chemical vapor deposition temperatures. For example, the melting point of yttrium chloride($YCl_3$) is 721° C. and that of gadolinium chloride($GdCl_3$) is 607° C. Thus, in order to achieve any practical chemical vapor deposition rate, very high temperatures (about 1200° C.) must be used.

A further prior art reference describing organometallic compounds is found in a patent to Cais et al. 3,326,948 issued June 20, 1967. That reference illustrates and describes organometallic carbonyl compounds of transition metals and rare earth(lanthanide) metals having cyclic and olefinic constituents. While these compounds do exhibit increased vapor pressures and may be used to reduce the chemical vapor deposition temperature, the preparation of such compounds is a relatively difficult and involved procedure and the handling of the resultant compounds is also difficult.

SUMMARY OF THE INVENTION

According to the present invention there is provided a method of simplifying the chemical vapor deposition of rare earth metals to form epitaxial garnet films by the use of easily prepared organometallic compounds having a relatively high vapor pressure. The metals include scandium, yttrium, lanthamun and lanthanide elements(atomic numbers Z=58-71) following lanthanum. These are combined by covalent bonding with suitable ligands including acetylacetone, benzoylacetone, fluorinated benzoylacetone, thenoyl tri-fluoroacetone, tri-n-butylphosphate, tri-n-octylphosphine oxide, sodium cyclopentadienide and 2,2,6,6-tetramethyl 3,5-heptanedione. It has been found that these compounds can be chemically vapor deposited in an inert atmosphere such as helium or argon at temperatures as low as 500° C.

DESCRIPTION OF THE PREFERRED EMBODIMENTS

Illustration 1

A known weight of yttrium chloride($YCl_3$) is combined with a known weight of thenoyl trifluoroacetone, acetylacetone, benzoylacetone, fluorinated benzoylacetone, tri-n-butylphosphate, tri-n-octylphosphine oxide, sodium cyclopentadienide, or 2,2,6,6-tetramethyl 3,5-heptanedione in a tetrahydrofuran solvent solution and refluxed for several hours. The tetrahydrofuran solvent is then removed by distillation under reduced pressure and the dry residue is transferred with conventional sublimation apparatus. The compound is then heated in the sublimation apparatus to a temperature from about 200° C. to about 250° C. at a pressure from about $10^{-1}$ mm of Hg to about $10^{-4}$ mm of Hg and the yttrium complex is sublimed and collected on a cooled glass container. Sublimation is carried on in an inert atmosphere of argon. The calculated yield is approximately 70% of the yttrium organic complex.

The yttrium is then chemically vapor deposited on a suitable ceramic substrate as galluim-gadolinium crystal available from Allied Chemical Corporation, Specialty Chemicals Division, Charlotte, North Carolina, in a conventional chemical vapor deposition apparatus. The yttrium complex compound is dissolved in a conventional organic solvent such as butanol or toluene and dispensed by use of an inert carrier gas. The use of an inert gas such as helium or argon or a mixture of such inert gas and nitrogen in the chemical vapor deposition process produces pure metal deposition of epitaxial garnet. The use of air or oxygen in the chemical deposition process produces the deposition of a layer of the metal oxide rather than the pure metal. Utilizing the above compounds, the chemical vapor deposition apparatus can be operated at temperatures as low as 500° C.

Illustration 2

The same process is used in illustration 1 is employed except gadolinium was used instead of yttrium in the process.

Because of the great similarity in properties between scandium, yttrium and the rare earth elements of the lanthanide series, it is believed that any one of such elements which is desired to be used in an epitaxial thin film garnet may be used in the same manner as in illustration 1. Lanthanium and the lanthanide elements(Z=57-71) correspond to belated filling of the 4f electron subshell in an electron configuration of . . . $4s^1 4p^6 4d^{10} 4f^{0-14} 5s^2 5p^6 5d^{0-1} 6s^2$. The 4f shell is third outermost and these changes in its electronic population are well screened from neighboring atoms by the two outer electron shells. This leads to remarkably similar chemical properties in these elements.

The embodiments of the invention in which an exclusive property or right is claimed are defined as follows:

1. In a method of preparing epitaxial thin films of metallic rare earth garnets by chemical vapor deposition in an inert atmosphere, the improvement comprising the step of depositing said rare earth metals in an epitaxial layer on a substrate from organic ligand compound forms which include at least one element from the group consisting of scandium, yttrium, lanthanum, and the lanthanide series combined with the compound selected from the group consisting of acetylacetone, thenoyl trifluoroacetone, benzoylacetone, fluorinated benzoylacetone, sodium cyclopentadienide, tri-n-butylphosphate, tri-n-octylphosphine oxide, and 2,2,6,6-tetramathyl 3,5-heptanedione.

2. The method of claim 1 wherein said lanthanide metal is selected from the group consisting of yttrium and gadolinium.

* * * * *